(12) United States Patent
Chen et al.

(10) Patent No.: US 12,277,965 B2
(45) Date of Patent: Apr. 15, 2025

(54) MEMORY STRUCTURE AND METHOD FOR OPERATING THE SAME

(71) Applicant: MACRONIX INTERNATIONAL CO., LTD., Hsinchu (TW)

(72) Inventors: Wei-Chen Chen, Taoyuan County (TW); Hang-Ting Lue, Hsinchu (TW)

(73) Assignee: MACRONIX INTERNATIONAL CO., LTD., Hsinchu (TW)

(*) Notice: Subject to any disclaimer, the term of this patent is extended or adjusted under 35 U.S.C. 154(b) by 230 days.

(21) Appl. No.: 18/319,513

(22) Filed: May 18, 2023

(65) Prior Publication Data

US 2024/0242759 A1    Jul. 18, 2024

Related U.S. Application Data

(60) Provisional application No. 63/439,281, filed on Jan. 17, 2023.

(51) Int. Cl.
*G11C 11/00* (2006.01)
*G11C 11/4067* (2006.01)
(Continued)

(52) U.S. Cl.
CPC ...... *G11C 11/4097* (2013.01); *G11C 11/4067* (2013.01); *H10B 12/10* (2023.02)

(58) Field of Classification Search
CPC .. G11C 11/4097; G11C 11/4067; H10B 12/10
See application file for complete search history.

(56) References Cited

U.S. PATENT DOCUMENTS

| 9,224,474 | B2 | 12/2015 | Lue |
| 11,380,373 | B1* | 7/2022 | Nour ................... G11C 11/2273 |

(Continued)

FOREIGN PATENT DOCUMENTS

| EP | 4303876 A1 | 1/2024 |
| JP | 2014135112 A | 7/2014 |

(Continued)

OTHER PUBLICATIONS

Partial EP Search Report dated Mar. 12, 2024 in EP application No. 23177943.0-1212.

(Continued)

*Primary Examiner* — Pho M Luu
(74) *Attorney, Agent, or Firm* — McClure, Qualey & Rodack, LLP

(57) ABSTRACT

A memory structure and methods for operating memory structures are provided. The memory structure includes a first, a second and a third gate structures disposed along a first direction and separated from each other, channel bodies having first ends and second ends, source regions separated from each other, having first conductivity types and connected to the first ends of the channel bodies respectively, drain regions separated from each other, having second conductivity types and connected to the second ends of the channel bodies respectively, and first side plugs disposed along a second direction, extending along a third direction, and electrically connected to the source regions and the channel bodies. The first gate structure includes island structures disposed along the second direction and extending along the third direction.

20 Claims, 6 Drawing Sheets

(51) Int. Cl.
 *G11C 11/4097* (2006.01)
 *H10B 12/10* (2023.01)

(56) References Cited

U.S. PATENT DOCUMENTS

| | | |
|---|---|---|
| 11,925,033 B2 | 3/2024 | Liu et al. |
| 11,934,480 B2 | 3/2024 | Lue et al. |
| 11,935,781 B2 | 3/2024 | Chang et al. |
| 11,956,968 B2 | 4/2024 | Wu et al. |
| 2006/0186481 A1 | 8/2006 | Yang et al. |
| 2012/0182801 A1 | 7/2012 | Lue |
| 2017/0053906 A1 | 2/2017 | Or-Bach |
| 2019/0206869 A1 | 7/2019 | Kim |
| 2021/0193834 A1 | 6/2021 | Yun |
| 2022/0068922 A1 | 3/2022 | Chen |
| 2022/0139948 A1 | 5/2022 | Lee |
| 2022/0392920 A1 | 12/2022 | Wu |
| 2023/0420043 A1* | 12/2023 | Lin .................... G11C 13/0009 |
| 2024/0008249 A1* | 1/2024 | Chen .................... H10D 62/121 |

FOREIGN PATENT DOCUMENTS

| | | |
|---|---|---|
| JP | 2020098658 A | 6/2020 |
| TW | 200631165 A | 9/2006 |
| TW | 202201750 A | 1/2022 |
| TW | 202209562 A | 3/2022 |
| TW | 202238838 A | 10/2022 |

OTHER PUBLICATIONS

JP Office Action dated Jun. 4, 2024 in JP application No. 2023-108068.
A 3D Stackable DRAM: Capacitor-less Three-Wordline Gate-Controlled Thyristor (GCT) RAM with >40 μ A Current Sensing Window, >1010 Endurance, and 3-second Retention at Room Temperature_202212.

\* cited by examiner

MEMORY STRUCTURE AND METHOD FOR OPERATING THE SAME

This application claims the benefit of US provisional application Serial No. This application claims the benefit of U.S. provisional application Ser. No. 63/439,281, filed Jan. 17, 2023, the subject matters of which are incorporated herein by references.

BACKGROUND

Technical Field

The present disclosure relates to a semiconductor structure and methods for operating the same, and more particular to a memory structure and methods for operating the same.

Description of the Related Art

With the advent of big data and artificial intelligence revolutions, the amount of data generated by human activities has grown explosively. In order to store and process large amounts of data, people increasingly need memory devices with high capacity and high computing speeds. However, in the existing processing system based upon Von Neumann architecture, a data processing unit (such as a central processing unit) and a data storage unit (such as a memory) are separated, the data processing unit receives data from the data storage unit for processing, and the results are sent to the data storage unit for storage. Data must be frequently transferred between the data processing unit and the data storage unit. In Von Neumann architecture, the speed of data storage and computing speed will be limited by transfer rates between the data processing unit and the data storage unit, and thus such architecture is difficult to load a large amount of data processing.

It is desirable to provide technology for an improved memory structure and methods for operating the same with high capacity, high computing speed and high endurance.

SUMMARY

According to an embodiment of the present disclosure, a memory structure is provided. The memory structure includes a first gate structure, a second gate structure, a third gate structure, a plurality of channel bodies, a plurality of source regions, a plurality of drain regions and a plurality of first side plugs. The first gate structure, the second gate structure and the third gate structure are disposed along a first direction and separated from each other. The plurality of channel bodies are separated from each other and passing through the first gate structure, the second gate structure and the third gate structure along the first direction. Each of the plurality of channel bodies has a first end and a second end separated from the first end. The plurality of source regions are separated from each other and having first conductivity types. The plurality of source regions are connected to the first ends of the plurality of channel bodies respectively. The plurality of drain regions are separated from each other and having second conductivity types. The plurality of drain regions are connected to the second ends of the plurality of channel bodies respectively. The first conductivity type is different from the second conductivity type. The plurality of first side plugs are disposed along a second direction and extending along a third direction. The plurality of first side plugs are separated from each other and electrically connected to the plurality of source regions and the plurality of channel bodies. The first direction, the second direction and the third direction are perpendicular to each other. The first gate structure includes a plurality of island structures separated from each other. The plurality of island structures are disposed along the second direction and extending along the third direction.

According to another embodiment of the present disclosure, a method for operating a memory structure is provided. The method includes a forward propagation step and a backward propagation step. The forward propagation step includes: inputting a plurality of input signals to a plurality of memory cells in a memory structure through a plurality of bit lines; producing a plurality of cell currents by the plurality of memory cells to a plurality of source lines on the basis of a plurality of weights stored in the plurality of memory cells; calculating sums of the plurality of cell currents on each source line to obtain a plurality of source line currents; converting the plurality of source line currents to an output signal. The backward propagation step includes: inputting a plurality of error input signals to the plurality of memory cells in the memory structure through a plurality of word lines; producing a plurality of error cell currents by the plurality of memory cells to the plurality of bit lines on the basis of the plurality of error input signals; calculating sums of the plurality of error cell currents on each bit line to obtain a plurality of error bit line currents; converting the plurality of error bit line currents to an error output signal; updating the plurality of weights in the plurality of memory cells on the basis of the error output signal.

According to yet another embodiment of the present disclosure, a method for operating a memory structure is provided. The method includes a forward propagation step. The forward propagation step includes: inputting a plurality of first input signals to a first memory cell array in a memory structure through a plurality of first bit lines; producing a plurality of first cell currents by the first memory cell array to a plurality of first source lines on the basis of a plurality of first weights stored in the first memory cell array; calculating sums of the plurality of first cell currents on each first source line to produce a plurality of first source line currents; inputting a plurality of second input signals to a second memory cell array in the memory structure through a plurality of second bit lines; producing a plurality of second cell currents by the second memory cell array to a plurality of second source lines on the basis of a plurality of second weights stored in the second memory cell array; calculating sums of the plurality of second cell currents on each second source line to obtain a plurality of second source line currents; converting the plurality of first source line currents and the plurality of second source line currents to an output signal. The plurality of first weights are positive weights, and the plurality of second weights are negative weights.

The above and other embodiments of the disclosure will become better understood with regard to the following detailed description of the non-limiting embodiment(s). The following description is made with reference to the accompanying drawings.

DETAILED DESCRIPTION

Figure 1:
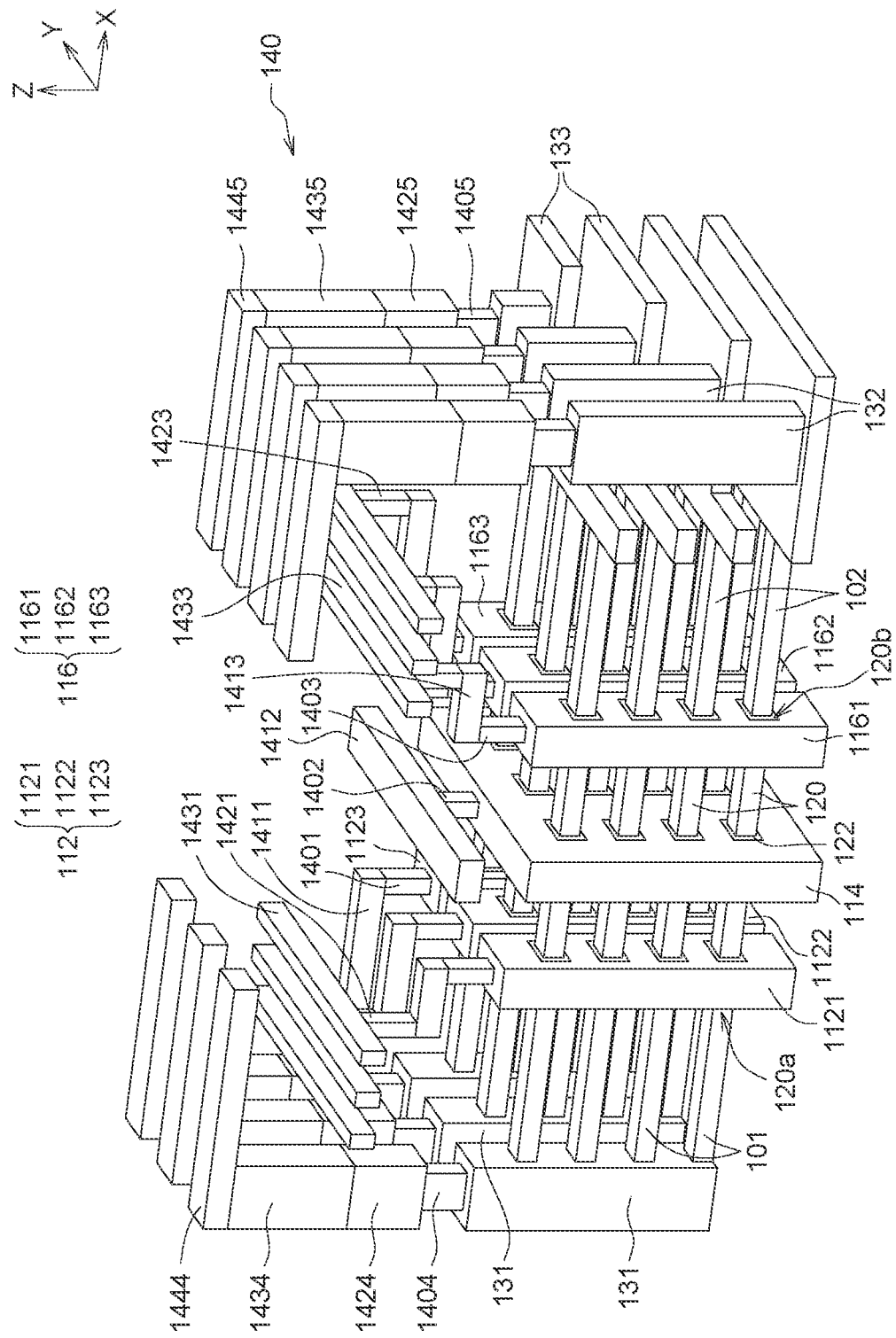
FIG. 1 illustrates a schematic view of a memory structure according to an embodiment of the present disclosure.

Various embodiments will be described more fully hereinafter with reference to accompanying drawings, which are provided for illustrative and explaining purposes rather than a limiting purpose. For clarity, the elements may not be drawn to scale. In addition, some elements and/or reference numerals may be omitted from some drawings. It is contemplated that the elements and features of one embodiment can be beneficially incorporated in another embodiment without further recitation.

Embodiments of the present disclosure may be applied in various types of three-dimensional stacked semiconductor devices. For example, embodiments may be applied to, but not limited to, a semiconductor device including stacked chips or a semiconductor package including stacked chips.

The present disclosure provides a three-dimensional memory structure including 3 transistors (3T).

Referring to FIG. 1. FIG. 1 illustrates a schematic view of a memory structure 10 according to an embodiment of the present disclosure. In this embodiment, X direction may represent a first direction, Y direction may represent a second direction, and Z direction may represent a third direction. The first direction, the second direction and the third direction are perpendicular to each other. The memory structure 10 includes a first gate structure 112, a second gate structure 114, a third gate structure 116, a plurality of channel bodies 120, a plurality of source regions 101, a plurality of drain regions 102, a plurality of dielectric films 122, a plurality of first side plugs 131, a plurality of second side plugs 132 and a plurality of side pads 133.

The first gate structure 112, the second gate structure 114 and the third gate structure 116 are disposed along X direction (e.g. the first direction) and separated from each other. The first gate structure 112, the second gate structure 114 and the third gate structure 116 may extend on planes defined by Y direction (e.g. the second direction) and Z direction (e.g. the third direction). The second gate structure 114 is between the first gate structure 112 and the third gate structure 116. The first gate structure 112 includes a first island structure 1121, a second island structure 1122 and a third island structure 1123 disposed along Y direction (e.g. the second direction) and separated from each other. The first island structure 1121, the second island structure 1122 and the third island structure 1123 may extend along Z direction (e.g. the third direction). The third gate structure 116 includes a fourth island structure 1161, a fifth island structure 1162 and a sixth island structure 1163 disposed along Y direction (e.g. the second direction) and separated from each other. The fourth island structure 1161, the fifth island structure 1162 and the sixth island structure 1163 may extend along Z direction (e.g. the third direction). The first island structure 1121, the second island structure 1122, the third island structure 1123, the fourth island structure 1161, the fifth island structure 1162 and the sixth island structure 1163 can be controlled independently. In an embodiment, the first gate structure 112, the second gate structure 114 and the third gate structure 116 may include semiconductor materials or metal materials. For example, the first gate structure 112, the second gate structure 114 and the third gate structure 116 may include monocrystalline silicon or polycrystalline silicon or metal.

Channel bodies 120 are separated from each other. Each channel body 120 extends along X direction (e.g. the first direction) and passes through the first gate structure 112, the second gate structure 114 and the third gate structure 116. Each channel body 120 has a first end 120a and a second end 120b separated from the first end 120a. The first end 120a of the channel body 120 and the second end 120b of the channel body 120 are at two opposite end portions of the channel body 120 along X direction (e.g. the first direction) respectively. Channel bodies 120 include a first group of channel bodies, a second group of channel bodies and a third group of channel bodies disposed along Y direction (e.g. the second direction). The second group of channel bodies is between the first group of channel bodies and the third group of channel bodies.

The first group of channel bodies includes channel bodies 120 disposed along Z direction (e.g. the third direction) (in the embodiment shown in FIG. 1, the first group of channel bodies includes 4 channel bodies, but the present disclosure is not limited thereto) and disposed in different levels. The first group of channel bodies passes through the first island structure 1121 of the first gate structure 112, the second gate structure 114 and the fourth island structure 1161 of the third gate structure 116. The second group of channel bodies includes channel bodies 120 disposed along Z direction (e.g. the third direction) (in the embodiment shown in FIG. 1, the second group of channel bodies includes 4 channel bodies, but the present disclosure is not limited thereto) and disposed in different levels. The second group of channel bodies passes through the second island structure 1122 of the first gate structure 112, the second gate structure 114 and the fifth island structure 1162 of the third gate structure 116. The third group of channel bodies includes channel bodies 120 disposed along Z direction (e.g. the third direction) (in the embodiment shown in FIG. 1, the third group of channel bodies includes 4 channel bodies, but the present disclosure is not limited thereto) and disposed in different levels. The third group of channel bodies passes through the third island structure 1123 of the first gate structure 112, the second gate structure 114 and the sixth island structure 1163 of the third gate structure 116.

The dielectric films 122 are between the first gate structure 112 and the channel bodies 120, between the second gate structure 114 and the channel bodies 120 and between the third gate structure 116 and the channel bodies 120. The dielectric films 122 may be on outer surfaces of the channel bodies 120. The dielectric film 122 surrounds the channel body 120. In an embodiment, the first gate structure 112 is electrically insulated from the channel bodies 120 through the dielectric films 122, the second gate structure 114 is electrically insulated from the channel bodies 120 through the dielectric films 122, and the third gate structure 116 is electrically insulated from the channel bodies 120 through the dielectric films 122. In an embodiment, the dielectric films surrounding different channel bodies 120 are connected to each other and cover the first gate structure 112, the second gate structure 114 and the third gate structure 116. In an embodiment, the channel body 120 can be formed by an epitaxial growth process. In an embodiment, the channel body 120 may include a semiconductor material such as monocrystalline silicon. During the operation (such as a programming or erasing operation) of the memory structure 10, the channel bodies 120 may be used to store carriers (e.g., electrons or holes). The dielectric films 122 do not need to have the function of storing carriers (e.g., electrons or holes). The dielectric films 122 may not include a charge storage structure, such as an oxide-nitride-oxide (ONO) structure. In other words, there may be no ONO structure between the channel bodies 120 and the gate structures (i.e. the first gate structure 112, the second gate structure 114 and the third gate structure 116). In an embodiment, the dielectric films 122 may include dielectric materials such as oxide. In an embodiment, the dielectric films 122 may be single-layer structures. In one embodiment, the dielectric films 122 may include high dielectric constant materials (high-k material).

In this embodiment, the first gate structure 112, the second gate structure 114 and the third gate structure 116 surround the dielectric films 122 and each channel body 120, so that the memory structure 10 may be understood as a gate-all-around (GAA) structure. Each channel body 120 may be controlled by three gates (i.e. the first gate structure 112, the second gate structure 114 and the third gate structure 116). The channel bodies 120 of the first group of channel bodies may be controlled by the first island structure 1121 of the first gate structure 112, the second gate structure 114 and the fourth island structure 1161 of the third gate structure 116. The channel bodies 120 of the second group of channel bodies may be controlled by the second island structure 1122 of the first gate structure 112, the second gate structure 114 and the fifth island structure 1162 of the third gate structure 116. The channel bodies 120 of the third group of channel bodies may be controlled by the third island structure 1123 of the first gate structure 112, the second gate structure 114 and the sixth island structure 1163 of the third gate structure 116. A transistor is formed at each of the intersections of the channel bodies 120 and the gate structures.

The source regions 101 are separated from each other. Each source region 101 extends along X direction (e.g. the first direction). The source regions 101 may be connected to the first ends 120a of the channel bodies 120 respectively. The drain regions 102 are separated from each other. Each drain region 102 extends along X direction (e.g. the first direction). The drain regions 102 may be connected to the second ends 120b of the channel bodies 120 respectively. Each channel body 120 may be connected to the corresponding source region 101 at the first end 120a and connected to the corresponding drain region 102 at the second end 120b. In an embodiment, the source regions 101 and the drain regions 102 may include semiconductor materials such as monocrystalline silicon. The source regions 101 may have first conductivity types. The drain regions 102 may have second conductivity types. The first conductivity type is different from the second conductivity type. In an embodiment, the first conductivity type may be an N-type, and the second conductivity type may be a P-type. In an embodiment, the source region 101 may be an N-type with a high doping concentration (N+), and the drain region 102 may be a P-type with a high doping concentration (P+).

The first side plugs 131 are disposed along Y direction (e.g. the second direction) and separated from each other. Each first side plug 131 extends along Z direction (e.g. the third direction). The first side plug 131 and the first gate structure 112 are at opposite ends of the source region 101 along X direction. The first side plug 131 may be electrically connected to the source region 101 and the channel body 120. One of the first side plugs 131 may be electrically connected to the first group of the channel bodies and the source regions 101 corresponding to the first group of the channel bodies, another one of the first side plugs 131 may be electrically connected to the second group of the channel bodies and the source regions 101 corresponding to the second group of the channel bodies, and the other one of the first side plugs 131 may be electrically connected to the third group of the channel bodies and the source regions 101 corresponding to the third group of the channel bodies.

The second side plugs 132 are disposed along Y direction (e.g. the second direction) and separated from each other. Each second side plug 132 extends along Z direction (e.g. the third direction). The second side plug 132 and the third gate structure 116 are at opposite ends of the drain region 102 along X direction. The side pads 133 are disposed along Z direction (e.g. the third direction) and separated from each other. The side pads 133 are at different levels respectively. The side pads 133 are electrically connected to the drain region 102. The second side plugs 132 may be electrically connected to the side pads 133 at different levels respectively. For example, in this embodiment, one of the second side plugs 132 (such as the shortest second plug 132 in FIG. 1) is electrically connected to the drain regions 102 at the uppermost level and the channel bodies 120 at the uppermost level through one of the side pads 133 (such as the side pad 133 at the uppermost level in FIG. 1); one of the second side plugs 132 (such as the longest second side plug 132 in FIG. 1) is electrically connected to the drain regions 102 at the lowest level and the channel bodies 120 at the lowest level through one of the side pads 133 (such as the side pad 133 at the lowest level in FIG. 1); the other second side plugs 132 are electrically connected to other side pads 133 in a similar manner. In this embodiment, the side pads 133 may form a stepped structure, but the present disclosure is not limited thereto. In an embodiment, the first side plugs 131, the second side plugs 132 and the side pads 133 may include semiconductor materials or metal metals. For example, the first side plugs 131, the second side plugs 132 and the side pads 133 may include monocrystalline silicon or polycrystalline silicon or metal.

The memory structure 10 may include an upper conductive structure 140 above the channel bodies 120. The upper conductive structure 140 includes a contact 1401 above the first gate structure 112, a first conductor layer 1411 (e.g. a metal layer ML1) above the contact 1401, a via 1421 above the first conductor layer 1411, and a second conductor layer 1431 (e.g. a metal layer ML2) above the via 1421. The first gate structure 112, the contact 1401, the first conductor layer 1411, the via 1421 and the second conductor layer 1431 are electrically connected to each other. The upper conductive structure 140 includes a contact 1402 above the second gate structure 114 and a first conductor layer 1412 (e.g. a metal layer ML1) above the contact 1402. The second gate structure 114, the contact 1402 and the first conductor layer 1412 are electrically connected to each other. The upper conductive structure 140 includes a contact 1403 above the third gate structure 116, a first conductor layer 1413 (e.g. a metal layer ML1) above the contact 1403, a via 1423 above the first conductor layer 1413, and a second conductor layer 1433 (e.g. a metal layer ML2) above the via 1423. The third gate structure 116, the contact 1403, the first conductor layer 1413, the via 1423 and the second conductor layer 1433 are electrically connected to each other.

The upper conductive structure 140 includes a contact 1404 above the first side plugs 131, a via 1424 above the contact 1404, a via 1434 above the via 1424, and a third conductor layer 1444 (e.g. a metal layer ML3) above the via 1434. The first side plugs 131, the via 1424, the via 1434 and the third conductor layer 1444 are electrically connected to each other. The upper conductive structure 140 includes a contact 1405 above the second side plugs 132, a via 1425 above the contact 1405, a via 1435 above the via 1425, and a third conductor layer 1445 (e.g. a metal layer ML3) above the via 1435. The second side plugs 132, the via 1425, the via 1435 and the third conductor layer 1445 are electrically connected to each other. In an embodiment, the contacts 1401, 1402, 1403, 1405 and 1405, the first conductor layers 1411, 1412 and 1413, the vias 1421, 1423, 1424, 1425, 1434 and 1435, the second conductor layers 1431 and 1433, and the third conductor layers 1444 and 1445 may include semiconductor materials and metal materials.

In an embodiment, the memory structure 10 may include insulating materials. For example, the insulating materials may include the insulating material between the first gate structure 112, the second gate structure 114 and the third gate structure 116, the insulating material between the first island structure 1121, the second island structure 1122 and the third island structure 1123, the insulating material between the fourth island structure 1161, the fifth island structure 1162 and the sixth island structure 1163, the insulating material the first side plugs 131, the insulating material between the second side plugs 132, and the insulating material between the side pads 133.

In an embodiment, the first gate structure 112, the second gate structure 114 and the third gate structure 116 may be functioned as word lines (WL) respectively. In an embodiment, the transistors formed at each of the intersections of the first gate structure 112 including island structures and the channel bodies 120 may be functioned as string selection transistors; the transistors formed at each of the intersections of the third gate structure 116 including island structures and the channel bodies 120 may be functioned as string selection transistors. In an embodiment, the memory structure 10 may include a plurality of source lines (SL) and a plurality of bit lines (BL) perpendicular to each other. For example, the source lines may extend along Z direction and the bit lines may extend along Y direction; the present disclosure is not limited thereto. The source lines may be electrically connected to the source regions 101 through the first side plugs 131. The bit lines may be electrically connected to the drain regions 102 through the second side plugs 132. In this embodiment, each channel body 120 and the source region 101 and the drain region 102 corresponding to this channel body 120 may be functioned as a thyristor. In an embodiment, the memory structure of the present disclosure may be functioned as a dynamic random-access memory (DRAM) with a three-dimensional structure, and an operating mechanism of the memory structure is on the basis of a thyristor. In an embodiment, a sum of product operation can be performed in the memory structure since the bit lines and the source lines are perpendicular to each other.

In an embodiment, the memory structure 10 may be formed by a stacked gate-all-around nanosheet CMOS process. The memory structure 10 with horizontal channels (i.e. channel bodies 120) can have more layers of channel bodies 120 being stacked along Z direction, so that more bits can be formed and the memory structure 10 with horizontal channels can have higher density of memory cells, which is more beneficial to the miniaturization of the size of the memory structure. In an embodiment, the memory structure 10 can have more channel bodies 120 being disposed along Y direction, and the first gate structure and the third gate structure may include more island structures, so that more bits can be formed and the memory structure 10 with horizontal channels can have higher density of memory cells, which is more beneficial to the miniaturization of the size of the memory structure.

Figure 2:
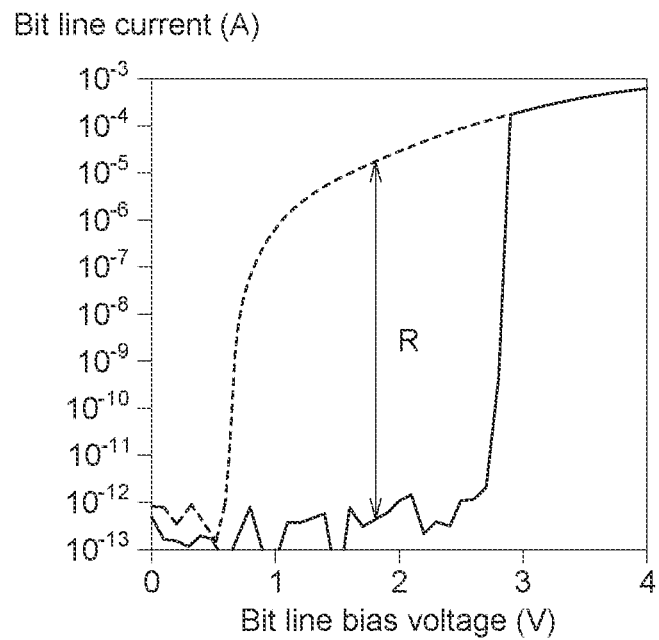
FIG. 2 shows the result of operating the memory structure as shown in FIG. 1.

Referring to FIG. 2. FIG. 2 shows the result of operating the memory structure 10 as shown in FIG. 1. The X axis represents the bit line bias voltage (VBL), and the unit is volts (V); the Y-axis represents the bit line current (IBL), and the unit is amperes (A). The dotted curve represents a programming operation of the memory structure 10 in which the memory cells of the memory structure are programmed to the data state of "1" (i.e., logic "1"). The solid curve represents an erasing operation of the memory structure 10 in which the memory cells of the memory structure 10 are programmed to the data state of "0" (i.e., logic "0"). The distance between the solid curve and the dotted curve under the same bit line bias voltage represents the ratio of the on-state and off-state current (on/off ratio). As shown in FIG. 2, when the bit line bias voltage is 1.8V, the memory structure 10 of the present disclosure has an on/off ratio R greater than 106, which means that the on-state and the off-state of the memory structure 10 are easy to distinguish and the memory structure 10 has a large memory window.

Figure 3:
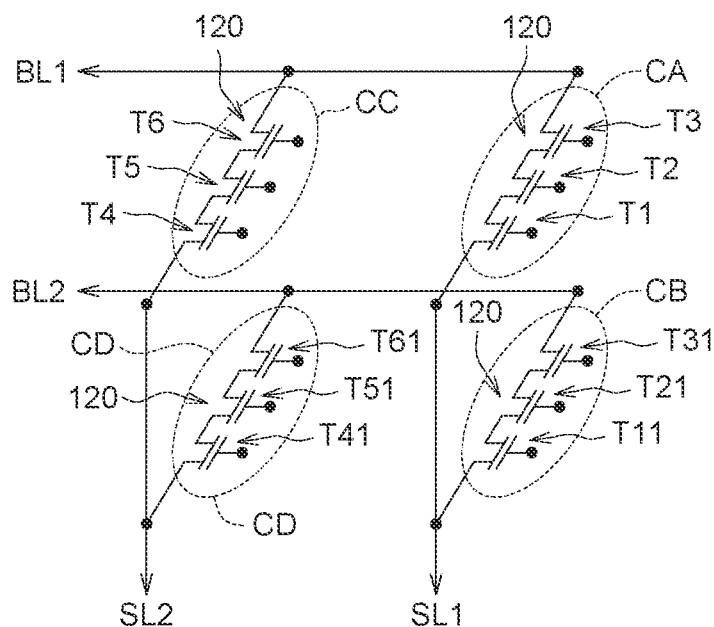
FIG. 3 illustrates an equivalent circuit diagram of a memory structure according to an embodiment of the present disclosure.

Referring to FIGS. 1 and 3. FIG. 3 illustrates an equivalent circuit diagram of a memory structure 10 according to an embodiment of the present disclosure. FIG. 3 schematically shows four adjacent channel bodies 120 in FIG. 1, for example, the four channel bodies 120 passing through the first island structure 1121 and the second island structure 1122 of the first gate structure 112, the second gate structure 114 and the fourth island structure 1161 and the fifth island structure 1162 of the third gate structure 116.

Transistor T1 and transistor T11 are formed respectively at the intersections of the first island structure 1121 and the channel bodies 120 at different levels. Transistor T4 and transistor T41 are formed respectively at the intersections of the second island structure 1122 and the channel bodies 120 at different levels. Transistors T2, T21, T5 and T51 are formed respectively at the intersections of the second gate structure 114 and the four channel bodies 120. Transistor T3 and transistor T31 are formed respectively at the intersections of the fourth island structure 1161 and the channel bodies 120 at different levels. Transistor T6 and transistor T61 are formed respectively at the intersections of the fifth island structure 1162 and the channel bodies 120 at different levels. The transistors T1, T2 and T3 are formed by the same channel body 120. The transistors T1, T2 and T3 together form a memory cell CA. The transistors T4, T5 and T6 are formed by the same channel body 120. The transistors T4, T5 and T6 together form a memory cell CC. The transistors T11, T21 and T31 are formed by the same channel body 120. The transistors T11, T21 and T31 together form a memory cell CB. The transistors T41, T51 and T61 are formed by the same channel body 120. The transistors T41, T51 and T61 together form a memory cell CD. The transistors T1, T2 and T3 (memory cell CA) are electrically connected to the source line SL1 and the bit line BL1. The transistors T4, T5 and T6 (memory cell CC) are electrically connected to the source line SL2 and the bit line BL1. The transistors T11, T21 and T31 (memory cell CB) are electrically connected to the source line SL1 and the bit line BL2. The transistors T41, T51 and T61 (memory cell CD) are electrically connected to the source line SL2 and the bit line BL2.

In an embodiment, a method for operating a memory structure according to the present disclosure includes a matrix multiplication operation. For example, when a matrix multiplication operation is performed in the memory structure 10, a plurality of input signals can be inputted to a plurality of memory cells through a plurality of bit lines electrically connected to the memory cells; the memory cells can produce a plurality of cell currents to a plurality of source lines on the basis of a plurality of weights stored in the memory cells and the input signals. For example, the input signals can be converted to the corresponding voltages through a conversion unit or the input signals are in the form of voltage, and a multiplication operation can be performed in the memory cells to obtain the cell currents on the basis of the voltages (or the input signals) and the weights. In this embodiment, the weight stored in the memory cell can be understood as conductance of the memory cell, and the product of the weight and the voltage is output as a current. The source line current output from each source line can be obtained by summing the cell currents on each source line. The obtained source line current is the result of the operation. In an embodiment, the obtained source line current can be converted to an output signal.

Taking the equivalent circuit diagram shown in FIG. 3 as an example, weight $w_{CA}$ is stored in the memory cell CA, weight $w_{CC}$ is stored in the memory cell CC, weight $w_{CB}$ is stored in the memory cell CB, and weight $w_{CD}$ is stored in the memory cell CD; an input signal $V_{BL1}$ in the form of voltage is inputted to the memory cells CA and CC through the bit line BL1, and an input signal $V_{BL2}$ in the form of voltage is inputted to the memory cells CB and CD through the bit line BL2; the memory cell CA produces a cell current $V_{BL1} \times w_{CA}$ to the source line SL1 on the basis of the weight stored in the memory cell CA and the input signal; the memory cell CC produces a cell current $V_{BL1} \times w_{CC}$ to the source line SL2 on the basis of the weight stored in the memory cell CC and the input signal; the memory cell CB produces a cell current $V_{BL2} \times w_{CB}$ to the source line SL1 on the basis of the weight stored in the memory cell CB and the input signal; the memory cell CD produces a cell current $V_{BL2} \times w_{CD}$ to the source line SL2 on the basis of the weight stored in the memory cell CD and the input signal. The source line current $I_{SL1}$ on the source line SL1 and the source line current $I_{SL2}$ on the source line SL2 can be represented by the following formula (1) and formula (2). As such, a matrix multiplication operation is realized.

$$I_{SL1} = V_{BL1} \times w_{CA} + V_{BL2} \times W_{CB} \quad \text{formula (1)}$$

$$I_{SL2} = V_{BL1} \times w_{CC} + V_{BL2} \times W_{CD} \quad \text{formula (2)}$$

In an embodiment, a method for operating a memory structure according to the present disclosure includes a forward propagation step and/or a backward propagation step. The forward propagation step includes: a plurality of input signals are inputted to a plurality of memory cells through a plurality of bit lines electrically connected to the memory cells (the bit lines are equipotential with the drain regions); the input signals can be converted to the corresponding voltages or the input signals are in the form of voltage; the memory cells produce a plurality of cell currents to a plurality of source lines (equipotential with the source regions) on the basis of a plurality of weights stored in the memory cells and the input signals; the sum of the cell currents on each source line is calculated to obtain source line currents; the source line currents are converted to an output signal. During the forward propagation step, positive voltage of input signals corresponding to positive voltage can be applied to the bit lines, and the source lines can be grounded. During the forward propagation step, the cell current inputted from each memory cell can be a product of the corresponding cell current (or may be understood as the corresponding voltage applied to the memory cell) and the corresponding weight (the weight stored in the memory cell). The backward propagation step includes a plurality of error input signals are inputted to the memory cells through a plurality of word lines electrically connected to the first gate structure; the error input signals can be converted to the corresponding error voltages or the error input signals are in the form of voltage; the memory cells produce a plurality of error cell currents to the bit lines on the basis of the error input signals; the sum of error cell currents on each bit line is calculated to obtain a plurality of error bit line currents; the error bit line currents are converted to an error output signal; the weights stored in the memory cells are updated on the basis of the error output signal. During the backward propagation step, the source lines can be grounded, voltage of −1V~2V is applied to the word lines electrically connected to the first gate structure, and a positive voltage is applied to the bit lines. Through the above steps for the backward propagation, a correct current direction is obtained, and a body effect can be reduced or avoided.

In an embodiment, the forward propagation step and the backward propagation step can be used in neural network training.

One of the forward propagation steps applicable to the memory structure of the present disclosure and one of the backward propagation steps applicable to the memory structure of the present disclosure will be described below with reference to FIG. 1 and FIGS. 4-6. The present disclosure is not limited thereto.

Figure 4:
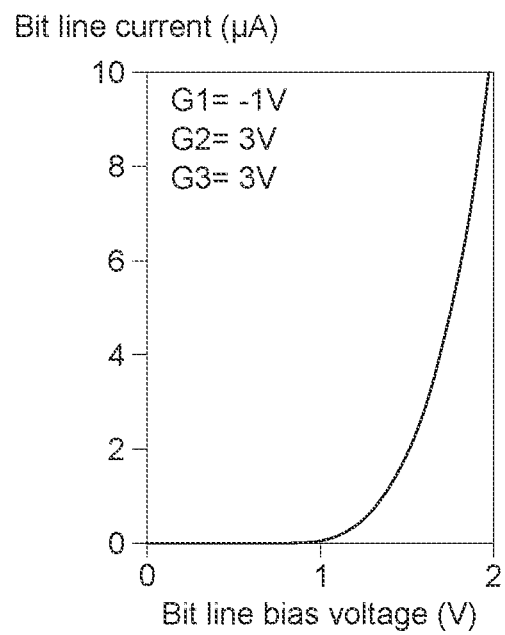
FIGS. 4-6 show the results of operating the memory structure as shown in FIG. 1.
Figure 5:
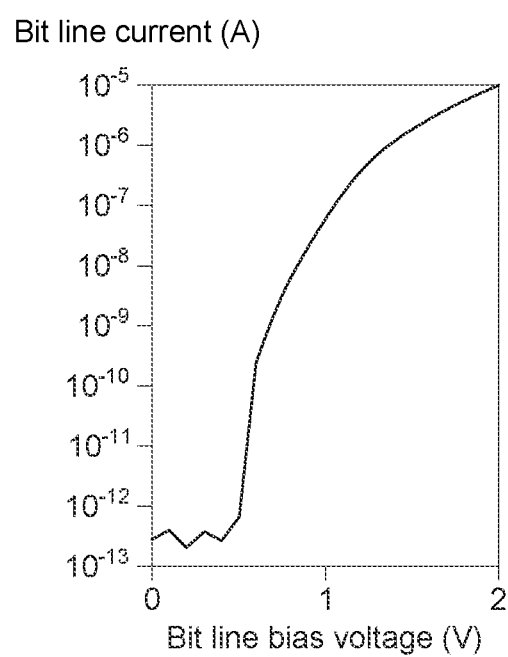

FIGS. 4-5 are diagrams showing the relationships between bit line current and bit line bias voltage obtained by performing a forward propagation step on the memory structure 10 shown in FIG. 1. In FIG. 4, the X axis represents the bit line bias voltage, and the unit is volts (V); the Y-axis represents the bit line current, and the unit is microamperes (μA). In FIG. 5, the X axis represents the bit line bias voltage, and the unit is volts (V); the Y-axis represents the bit line current, and the unit is amperes (A). In this embodiment, the voltages applied to the second gate structure 114 and the third gate structure 116 are 3V, the voltage applied to the first gate structure 112 is −1V, the voltages applied to the source lines (equipotential with the source regions 101) are 0V (grounded), and the voltages applied to the bit lines (equipotential with the drain regions 102) are 0V~2V. As shown in FIGS. 4-5, due to the presence of PN diodes in the memory structure 10, as the bit line bias voltage increases, the bit line current increases exponentially. As shown in FIGS. 4-5, the bit line bias voltage suitable for forward propagation step can be ranged from 1V (corresponding to a bit line current of 100 nanoamperes (nA)) to 2V (corresponding to a bit line current of 10 microamperes (μA)).

Figure 6:
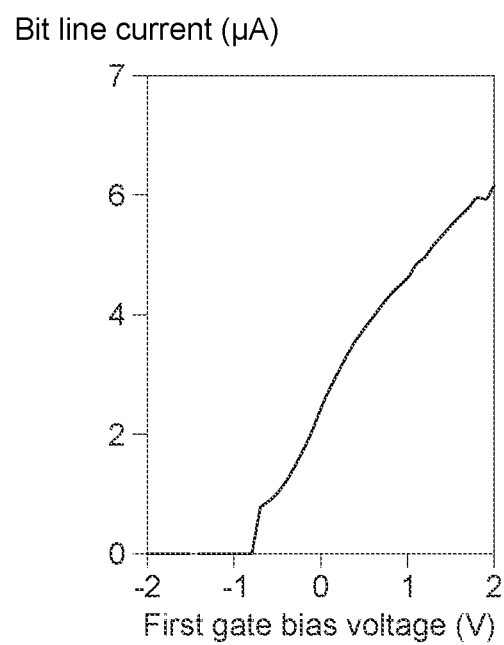

FIG. 6 is a diagram showing the relationship between bit line current and first gate bias voltage (the voltage applied to the first gate structure) obtained by performing a backward propagation step on the memory structure 10 shown in FIG. 1. In FIG. 6, the X axis represents the first gate bias voltage, and the unit is volts (V); the Y-axis represents the bit line current, and the unit is microamperes (μA). In this embodiment, the voltages applied to the second gate structure 114 and the third gate structure 116 are 3V, the voltages applied to the bit lines (equipotential with the drain regions 102) are 1.2V, the voltages applied to the source lines (equipotential with the source regions 101) are 0V (grounded), and the voltage applied to the first gate structure 112 is −2V~2V. As shown in FIG. 6, as the first gate bias voltage increases, the bit line current increases linearly. As shown in FIG. 6, the first gate bias voltage suitable for backward propagation step can be ranged from −1V to 2V.

Figure 7:
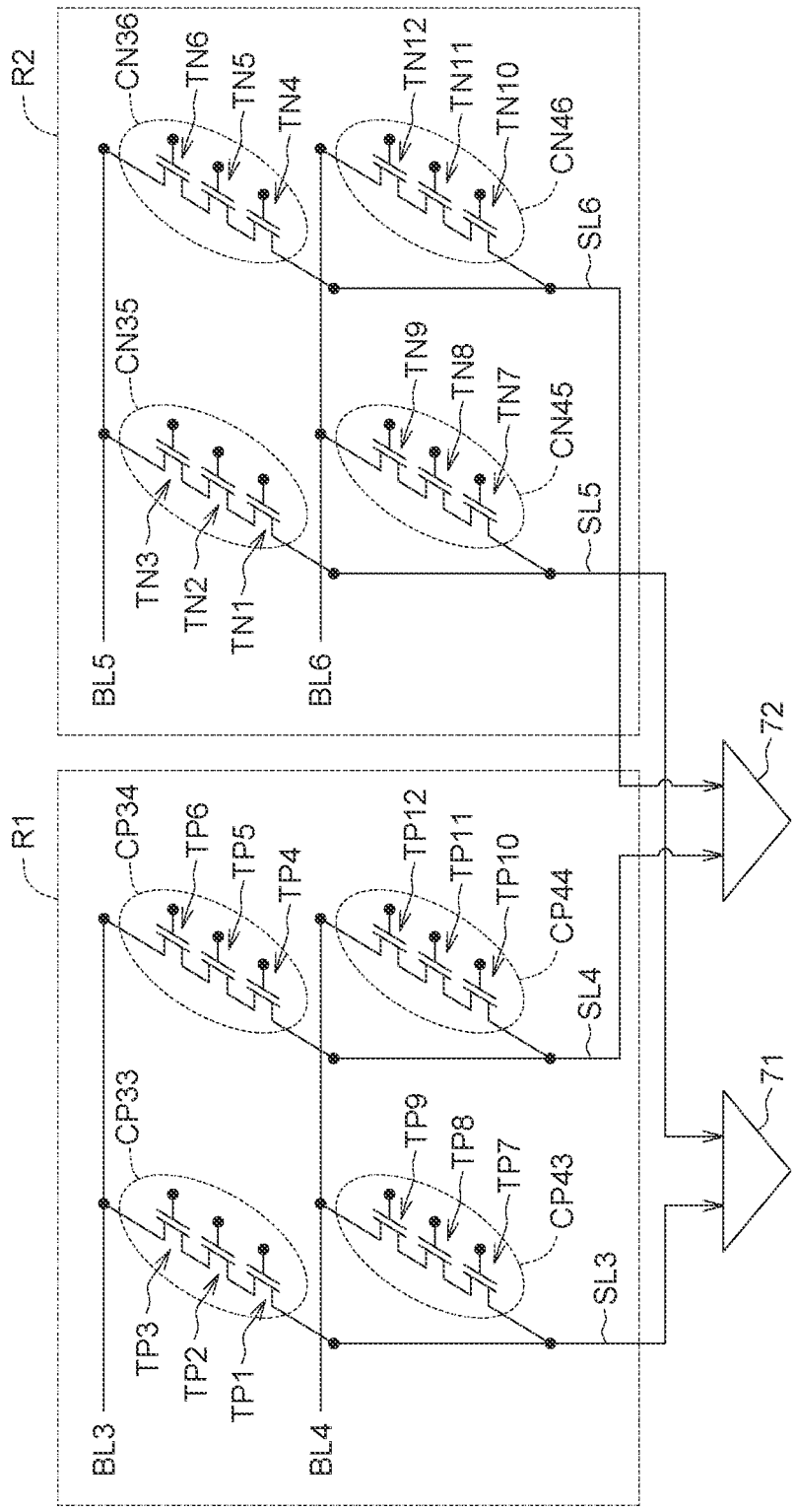
FIG. 7 illustrates an equivalent circuit diagram of a memory structure according to an embodiment of the present disclosure.
Figure 8:
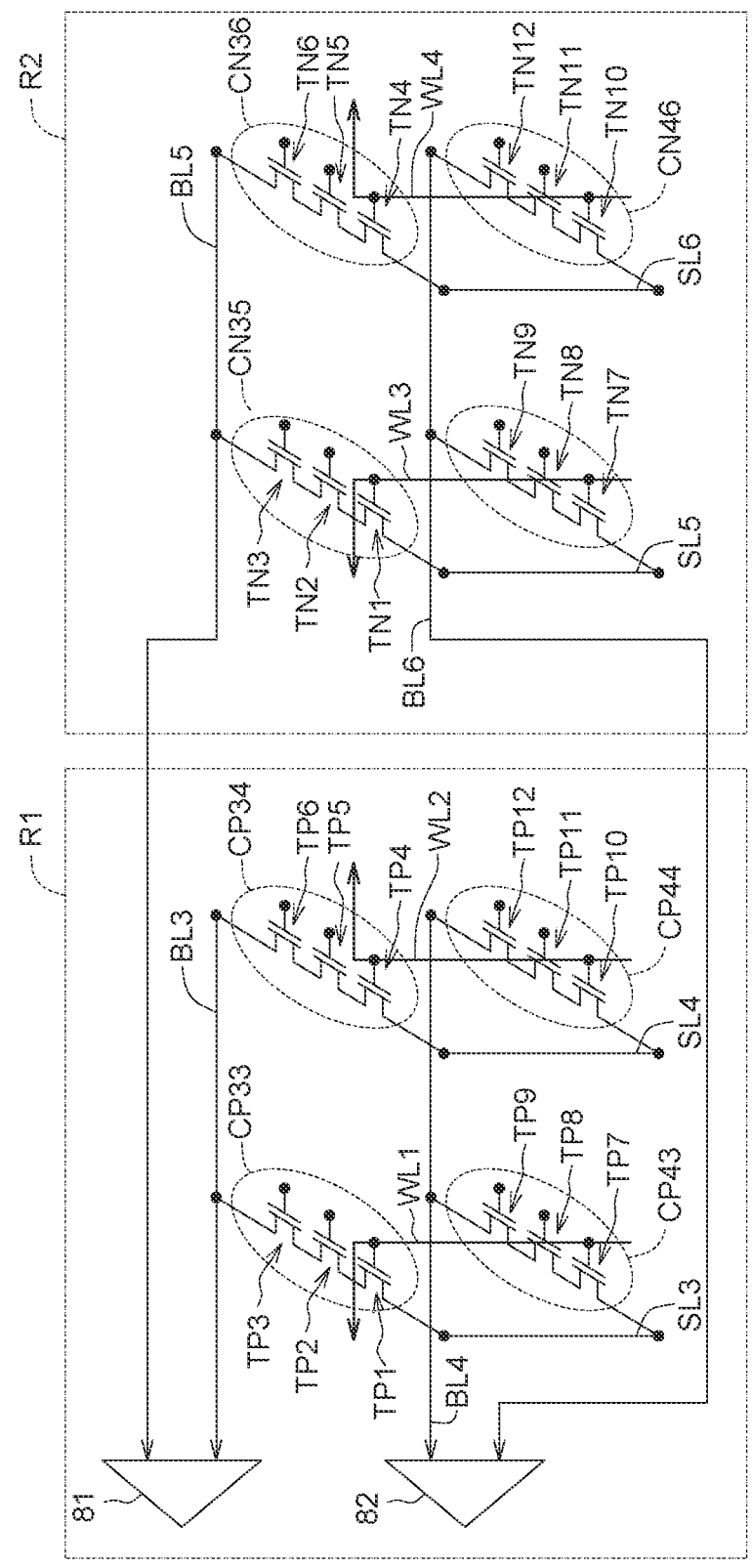
FIG. 8 illustrates an equivalent circuit diagram of a memory structure according to an embodiment of the present disclosure.

In an embodiment, the method for operating a memory structure according to the present disclosure includes storing positive weights and negative weights in different memory cell arrays in the memory structure, and then performing a forward propagation step and/or a backward propagation step. One of the operation methods applicable to the memory structure of the present disclosure will be described below with reference to FIGS. 7-8. The present disclosure is not limited thereto. FIGS. 7-8 illustrate equivalent circuit diagrams of memory structures 20 according to embodiments of the present disclosure. Memory structure 20 may have a structure similar to the memory structure 10 shown in FIG. 1.

The memory structure 20 includes a first memory cell array R1 and a second memory cell array R2. The first memory cell array R1 and the second memory cell array R2 includes different memory cells. In the first memory cell array R1, transistors TP1, TP4, TP7 and TP10 are formed respectively at the intersections of two island structures of the first gate structure and four channel bodies, transistors TP2, TP5, TP8 and TP11 are formed respectively at the intersections of the second gate structure and the four channel bodies, and transistors TP3, TP6, TP9 and TP12 are formed respectively at the intersections of two island structures of the third gate structure and the four channel bodies. The transistors TP1, TP2 and TP3 are formed by the same channel body. The transistors TP1, TP2 and TP3 together form a memory cell CP33. The transistors TP4, TP5 and TP6 are formed by the same channel body. The transistors TP4, TP5 and TP6 together form a memory cell CP34. The transistors TP7, TP8 and TP9 are formed by the same channel body. The transistors TP7, TP8 and TP9 together form a memory cell CP43. The transistors TP10, TP11 and TP12 are formed by the same channel body. The transistors TP10, TP11 and TP12 together form a memory cell CP44. The memory cell CP33 is electrically connected to the bit line BL3 and the source line SL3. The memory cell CP34 is electrically connected to the bit line BL3 and the source line SL4. The memory cell CP43 is electrically connected to the bit line BL4 and the source line SL3. The memory cell CP44 is electrically connected to the bit line BL4 and the source line SL4. In the second memory cell array R2, transistors TN1, TN4, TN7 and TN10 are formed respectively at the intersections of two island structures of the first gate structure and four channel bodies, transistors TN2, TN5, TN8 and TN11 are formed respectively at the intersections of the second gate structure and the four channel bodies, and transistors TN3, TN6, TN9 and TN12 are formed respectively at the intersections of two island structures of the third gate structure and the four channel bodies. The transistors TN1, TN2 and TN3 are formed by the same channel body. The transistors TN1, TN2 and TN3 together form a memory cell CN35. The transistors TN4, TN5 and TN6 are formed by the same channel body. The transistors TN4, TN5 and TN6 together form a memory cell CN36. The transistors TN7, TN8 and TN9 are formed by the same channel body. The transistors TN7, TN8 and TN9 together form a memory cell CN45. The transistors TN10, TN11 and TN12 are formed by the same channel body. The transistors TN10, TN11 and TN12 together form a memory cell CN46. The memory cell CN35 is electrically connected to the bit line BL5 and the source line SL5. The memory cell CN36 is electrically connected to the bit line BL5 and the source line SL6. The memory cell CN45 is electrically connected to the bit line BL6 and the source line SL5. The memory cell CN46 is electrically connected to the bit line BL6 and the source line SL6.

In the memory structure 20, weights $w_{33}$, $w_{34}$, $w_{43}$ and $w_{44}$ (such as first weights) are stored in the memory cells CP33, CP34, CP43 and CP44 respectively, and the weights $w_{33}$, $w_{34}$, $w_{43}$ and $w_{44}$ are positive weights. In the memory structure 20, weights $w_{35}$, $w_{36}$, $w_{45}$ and $w_{46}$ (such as second weights) are stored in the memory cells CN35, CN36, CN45 and CN46 respectively, and the weights $w_{35}$, $w_{36}$, $w_{45}$ and $w_{46}$ are negative weights.

The operation method may include performing a forward propagation step on the memory structure 20, which includes the following steps. Input signals $V_{BL3}$ and $V_{BL4}$ (e.g. first input signals) in the form of voltage is inputted to the first memory cell array R1 through the bit lines BL3 and BL4 (e.g. first bit lines). Input signals $V_{BL5}$ and $V_{BL6}$ (e.g. second input signals) in the form of voltage is inputted to the second memory cell array R2 through the bit lines BL5 and BL6 (e.g. second bit lines). The input signal $V_{BL3}$ and the input signal $V_{BL5}$ can be the same. The input signal $V_{BL4}$ and the input signal $V_{BL6}$ can be the same. On the basis of the weights $w_{33}$, $w_{34}$, $w_{43}$ and $w_{44}$ (such as first weights) stored in the first memory cell array R1 and the input signals, multiplication operations are performed in the memory cells CP33 and CP43 in the first memory cell array R1 to produces the corresponding first cell currents to the source line SL3 (e.g. a first source line), and multiplication operations are performed in the memory cells CP34 and CP44 in the first memory cell array R1 to produces the corresponding first cell currents to the source line SL4 (e.g. a first source line). The first source line currents $O1^+$ and $O2^+$ are obtained by summing the first cell currents on the source lines SL3 and SL4 respectively. On the basis of the weights $w_{35}$, $w_{36}$, $w_{45}$ and $w_{46}$ (such as second weights) stored in the second memory cell array R2 and the input signals, multiplication operations are performed in the memory cells CN35 and CN45 in the second memory cell array R2 to produces the corresponding second cell currents to the source line SL5 (e.g. a second source line), and multiplication operations are performed in the memory cells CN36 and CN46 in the second memory cell array R2 to produces the corresponding second cell currents to the source line SL6 (e.g. a second source line). The second source line currents $O1^-$ and $O2^-$ are obtained by summing the second cell currents on the source lines SL5 and SL6 respectively. The first source line currents $O1^+$ and $O2^+$ and the second source line currents $O1^-$ and $O2^-$ can be converted to an output signal through a convertor 71 and a convertor 72. Specifically, the output signal includes a first output signal and a second output signal, the first output signal is formed by converting the first source line currents $O1^+$ and the second source line currents $O1^-$ through the convertor 71, and the second output signal is formed by converting the first source line currents $O2^+$ and the second source line currents $O2^-$ through the convertor 72. The computing in the forward propagation step can be represented by the following formula (3).

$$\begin{pmatrix} w_{33} - w_{35} & w_{43} - w_{45} \\ w_{34} - w_{36} & w_{44} - w_{46} \end{pmatrix} \begin{pmatrix} V_{BL3} \\ V_{BL4} \end{pmatrix} = \begin{pmatrix} O1^+ - O1^- \\ O2^+ - O2^- \end{pmatrix} = \begin{pmatrix} O1 \\ O2 \end{pmatrix} \quad \text{formula (3)}$$

The operation method may include performing a backward propagation step on the memory structure 20, which includes the following steps. Error input signals 81 and 82 (e.g. first error input signals) in the form of voltage is inputted to the first memory cell array R1 through the word lines WL1 and WL2 (e.g. first word lines) electrically connected to the first gate structure. Error input signals 83 and 84 (e.g. second error input signals) in the form of voltage is inputted to the second memory cell array R2 through the word lines WL3 and WL4 (e.g. second word lines) electrically connected to the first gate structure. The error input signal 81 and the error input signal 83 can be the same. The error input signal 82 and the error input signal 83 can be the same. On the basis of the weights stored in the first memory cell array R1 and the error input signals 81 and 82, the memory cells CP33 and CP34 in the first memory cell array R1 produce the corresponding first error cell currents to the bit line BL3, and the memory cells CP43 and CP44 in the first memory cell array R1 produce the corresponding first error cell currents to the bit line BL4. The first error bit line currents σ1$^+$ and σ2$^+$ are obtained by summing the first error cell currents on the bit lines BL3 and BL4 respectively. On the basis of the weights stored in the second memory cell array R2 and the error input signals 83 and 84, the memory cells CN35 and CN36 in the second memory cell array R2 produce the corresponding second error cell currents to the bit line BL5, and the memory cells CN45 and CN46 in the second memory cell array R2 produce the corresponding second error cell currents to the bit line BL6. The second error bit line currents σ1$^-$ and σ2$^-$ are obtained by summing the second error cell currents on the bit lines BL5 and BL6 respectively. The first error bit line currents σ1$^+$ and σ2$^+$ and the second error bit line currents σ1$^-$ and σ2$^-$ can be converted to an error output signal through a convertor 81 and a convertor 82. Specifically, the error output signal includes a first error output signal and a second error output signal, the first error output signal is formed by converting the first error bit line currents σ1$^+$ and the second error bit line currents σ1$^-$ through the convertor 81, and the second output signal is formed by converting the first error bit line currents σ2$^+$ and the second error bit line currents σ2$^-$ through the convertor 82. The computing in the backward propagation step can be represented by the following formula (4).

$$\begin{pmatrix} w_{33}-w_{35} & w_{43}-w_{45} \\ w_{34}-w_{36} & w_{44}-w_{46} \end{pmatrix} \begin{pmatrix} \delta_1 \\ \delta_2 \end{pmatrix} = \begin{pmatrix} \sigma 1^+ - \sigma 1^- \\ \sigma 2^+ - \sigma 2^- \end{pmatrix} = \begin{pmatrix} \sigma 1 \\ \sigma 2 \end{pmatrix} \quad \text{formula (4)}$$

The operation method may include updating the weights $w_{33}$, $w_{34}$, $w_{43}$ and $w_{44}$ (such as first weights) in the first memory cell array R1, and the weights $w_{35}$, $w_{36}$, $w_{45}$ and $w_{46}$ (such as second weights) in the second memory cell array R2.

In a Comparative Example, the positive weights and the negative weights are stored in the same memory cell array. As compared with the Comparative Example, the present disclosure stores the positive weights and the negative weights in different memory cell arrays, which can avoid the problem that the weight matrix of the forward propagation step and the weight matrix of the backward propagation step cannot be transposed to each other.

In an embodiment, the method for operating a memory structure according to the present disclosure includes using shifters and adders to increase the number of bits stored in each memory cell from a single bit (that is, a single memory cell can be programmed to the logic "1" or logic "0") to multiple bits. Thus, the weight stored in each memory cell can be increased from single-level to multi-levels.

According to the embodiments described above, the memory structure of the present disclosure includes memory cells electrically connected to different source lines (for example, the memory cells are electrically connected to different source lines through the first side plug 131 separated from each other); such a configuration allows the output value of each source line to be calculated separately and enables the memory structure of the present disclosure to perform matrix multiplication operations, and thus the memory structure of the present disclosure can be applied to the field of neural devices or artificial intelligence (AI). A computing-in-memory operation can be performed in the memory structure and the method for operating a memory structure of the present disclosure, data does not need to be transferred between the data processing unit and the data storage unit, and thus the memory structure and the method for operating a memory structure of the present disclosure can significantly improve the computing speed and the ability to process a large amount of data as compared with the Von Neumann architecture. The present disclosure provides a DRAM with a three-dimensional structure capable of performing computing-in-memory operations and the operating mechanism of the memory structure is on the basis of a thyristor, so that it shows the characteristics of high capacity, high storage density, high scalability, high endurance, high data retention time and high computing speeds. In addition, with the above features, the present disclosure can be applied to artificial intelligence training involving a large amount of data calculation, which can solve the problems of insufficient memory capacity and transmission bandwidth in artificial intelligence training, and can significantly improve the efficiency if artificial intelligence training.

It is noted that the elements and methods as described above are provided for illustration. The disclosure is not limited to the configurations and procedures disclosed above. Other embodiments with different configurations of known elements can be applicable, and the exemplified elements could be adjusted and changed based on the actual needs of the practical applications. It is, of course, noted that the configurations of figures are depicted only for demonstration, not for limitation. Thus, it is known by people skilled in the art that the related elements and layers in a semiconductor element, the shapes or positional relationship of the elements and the procedure details could be adjusted or changed according to the actual requirements and/or manufacturing steps of the practical applications.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A memory structure, comprising:
   a first gate structure, a second gate structure and a third gate structure disposed along a first direction and separated from each other;
   a plurality of channel bodies separated from each other and passing through the first gate structure, the second gate structure and the third gate structure along the first direction, each of the plurality of channel bodies has a first end and a second end separated from the first end;
   a plurality of source regions separated from each other and having first conductivity types, wherein the plurality of source regions are connected to the first ends of the plurality of channel bodies respectively;
   a plurality of drain regions separated from each other and having second conductivity types, wherein the plurality of drain regions are connected to the second ends of the plurality of channel bodies respectively, and the first conductivity type is different from the second conductivity type; and a plurality of first side plugs disposed along a second direction and extending along a third direction, wherein the plurality of first side plugs are separated from each other and electrically connected to the plurality of source regions and the plurality of channel bodies, and the first direction, the second direction and the third direction are perpendicular to each other, wherein the first gate structure comprises a plurality of island structures separated from each other, the plurality of island structures are disposed along the second direction and extending along the third direction.

2. The memory structure according to claim 1, further comprising:

a plurality of second side plugs disposed along the second direction and extending along the third direction, wherein the plurality of second side plugs are separated from each other and electrically connected to the plurality of drain regions and the plurality of channel bodies.

3. The memory structure according to claim 2, further comprising:

a plurality of source lines electrically connected to the plurality of source regions through the plurality of first side plugs; and a plurality of bit lines electrically connected to the plurality of drain regions through the plurality of second side plugs, wherein the plurality of source lines and the plurality of bit lines are perpendicular to each other.

4. The memory structure according to claim 1, further comprising:

a plurality of side pads disposed along the third direction and separated from each other, wherein the plurality of side pads are connected to the plurality of drain regions.

5. The memory structure according to claim 1, wherein the first conductivity type is an N-type, and the second conductivity type is a P-type.

6. A method for operating a memory structure, comprising:

a forward propagation step comprising:
inputting a plurality of input signals to a plurality of memory cells in a memory structure through a plurality of bit lines;
producing a plurality of cell currents by the plurality of memory cells to a plurality of source lines on the basis of a plurality of weights stored in the plurality of memory cells;
calculating sums of the plurality of cell currents on each source line to produce a plurality of source line currents; and
converting the plurality of source line currents to an output signal; and a backward propagation step comprising:
inputting a plurality of error input signals to the plurality of memory cells in the memory structure through a plurality of word lines;
producing a plurality of error cell currents by the plurality of memory cells to the plurality of bit lines on the basis of the plurality of error input signals;
calculating sums of the plurality of error cell currents on each bit line to obtain a plurality of error bit line currents;
converting the plurality of error bit line currents to an error output signal; and
updating the plurality of weights in the plurality of memory cells on the basis of the error output signal.

7. The method according to claim 6, wherein the plurality of source lines are grounded during the backward propagation step.

8. The method according to claim 6, wherein voltages of $-1V\sim 2V$ are applied to the plurality of word lines during the backward propagation step.

9. The method according to claim 6, wherein positive voltages are applied to the plurality of bit lines during the backward propagation step.

10. The method according to claim 6, wherein positive voltages are applied to the plurality of bit lines and the plurality of source lines are grounded during the forward propagation step.

11. The method according to claim 6, wherein the memory structure is a dynamic random-access memory (DRAM).

12. The method according to claim 6, wherein an operating mechanism of the memory structure is on the basis of a thyristor.

13. The method according to claim 6, wherein each memory cell performs a multiplication operation on the basis of the corresponding input signal and the corresponding weight to produce the corresponding cell current during the forward propagation step.

14. A method for operating a memory structure, comprising:

a forward propagation step comprising:
inputting a plurality of first input signals to a first memory cell array in a memory structure through a plurality of first bit lines;
producing a plurality of first cell currents by the first memory cell array to a plurality of first source lines on the basis of a plurality of first weights stored in the first memory cell array;
calculating sums of the plurality of first cell currents on each first source line to produce a plurality of first source line currents;
inputting a plurality of second input signals to a second memory cell array in the memory structure through a plurality of second bit lines;
producing a plurality of second cell currents by the second memory cell array to a plurality of second source lines on the basis of a plurality of second weights stored in the second memory cell array;
calculating sums of the plurality of second cell currents on each second source line to obtain a plurality of second source line currents; and
converting the plurality of first source line currents and the plurality of second source line currents to an output signal,
wherein the plurality of first weights are positive weights, and the plurality of second weights are negative weights.

15. The method according to claim 14, wherein the output signal comprises a first output signal and a second output signal, the first output signal is formed by converting a portion of the plurality of first source line currents and a portion of the plurality of second source line currents, and the second output signal is formed by converting another portion of the plurality of first source line currents and another portion of the plurality of second source line currents.

16. The method according to claim 14, wherein the memory structure is a dynamic random-access memory.

17. The method according to claim 14, wherein an operating mechanism of the memory structure is on the basis of a thyristor.

18. The method according to claim 14, further comprising a backward propagation step comprising:
- inputting a plurality of first error input signals to the first memory cell array in the memory structure through a plurality of first word lines;
- producing a plurality of first error cell currents by the first memory cell array to the plurality of first bit lines on the basis of the plurality of first error input signals;
- calculating sums of the plurality of first error cell currents on each first bit line to obtain a plurality of first error bit line currents;
- inputting a plurality of second error input signals to the second memory cell array in the memory structure through a plurality of second word lines;
- producing a plurality of second error cell currents by the second memory cell array to the plurality of second bit lines on the basis of the plurality of second error input signals;
- calculating sums of the plurality of second error cell currents on each second bit line to obtain a plurality of second error bit line currents;
- converting the plurality of first error bit line currents and the plurality of second error bit line currents to an error output signal; and
- updating the plurality of first weights in the first memory cell array and the plurality of second weights in the second memory cell array on the basis of the error output signal.

19. The method according to claim 18, wherein the error output signal comprises a first error output signal and a second error output signal, the first error output signal is formed by converting a portion of the plurality of first error bit line currents and a portion of the plurality of second error bit line currents, and the second error output signal is formed by is formed by converting another portion of the plurality of first error bit line currents and another portion of the plurality of second error bit line currents.

20. The method according to claim 18, wherein the memory structure is a dynamic random-access memory, and an operating mechanism of the memory structure is on the basis of a thyristor.

* * * * *